United States Patent
Chen et al.

(10) Patent No.: US 9,900,005 B2
(45) Date of Patent: Feb. 20, 2018

(54) SWITCH CELL STRUCTURE AND METHOD

(71) Applicant: TAIWAN SEMICONDUCTOR MANUFACTURING CO., LTD., Hsin-Chu (TW)

(72) Inventors: Chih-Liang Chen, Hsinchu (TW); Chi-Yeh Yu, Hsinchu (TW); Ho Che Yu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/167,139

(22) Filed: May 27, 2016

(65) Prior Publication Data

US 2017/0346485 A1 Nov. 30, 2017

(51) Int. Cl.
*H03K 17/687* (2006.01)

(52) U.S. Cl.
CPC ................................ *H03K 17/6874* (2013.01)

(58) Field of Classification Search
CPC .................................................. H03K 17/6874
USPC .............................................................. 327/434
See application file for complete search history.

(56) References Cited

U.S. PATENT DOCUMENTS

| | | | | |
|---|---|---|---|---|
| 5,742,099 | A * | 4/1998 | Debnath | ............... H01L 23/5286 257/207 |
| 6,202,191 | B1 * | 3/2001 | Filippi | ................ G06F 17/5077 257/522 |
| 8,421,205 | B2 | 4/2013 | Yang | |
| 8,661,389 | B2 | 2/2014 | Chern et al. | |
| 8,698,205 | B2 | 4/2014 | Tzeng et al. | |
| 8,826,212 | B2 | 9/2014 | Yeh et al. | |
| 8,836,141 | B2 | 9/2014 | Chi et al. | |
| 8,875,076 | B2 | 10/2014 | Lin et al. | |
| 9,147,029 | B2 | 9/2015 | Ke et al. | |
| 2007/0283310 | A1 * | 12/2007 | Hiraga | ................... G11C 5/141 257/207 |
| 2014/0264924 | A1 | 9/2014 | Yu et al. | |
| 2014/0282289 | A1 | 9/2014 | Hsu et al. | |
| 2015/0279453 | A1 | 10/2015 | Fujiwara et al. | |
| 2015/0318241 | A1 | 11/2015 | Chang et al. | |
| 2015/0347659 | A1 | 12/2015 | Chiang et al. | |
| 2015/0357279 | A1 | 12/2015 | Fujiwara et al. | |
| 2016/0012169 | A1 | 1/2016 | Chiang et al. | |

* cited by examiner

*Primary Examiner* — Lincoln Donovan
*Assistant Examiner* — Metasebia Retebo
(74) *Attorney, Agent, or Firm* — Duane Morris LLP

(57) ABSTRACT

A switch cell structure includes a switch cell of a first type, which includes a master switch cell and a plurality of slave switch cells. The master switch cell includes a buffer having an input and an output and a transistor having a gate coupled to the output of the buffer. The slave switch cell includes a respective signal line having an input and output and a transistor having a gate coupled to the signal line, the signal lines of the slave switch cells are coupled to one another, with the output of one coupled to the input of another of the signal lines. The output of the buffer of the master switch cell is coupled to an input of one of the signal lines of slave switch cells to drive the plurality of slave switch cells.

20 Claims, 11 Drawing Sheets

SWITCH CELL STRUCTURE AND METHOD

BACKGROUND

This disclosure relates to power networks of integrated circuits. Typically, a power network of an integrated circuit (IC) chip includes a plurality of layers of conductive lines which are arranged, for example, as a mesh network, and a plurality of interlayer vias that interconnect different layers of conductive lines. In the mesh network, conductive lines in an upper layer of the IC cross over conductive lines in a lower layer. Corresponding to where the conductive lines in the upper layer overlap with the conductive lines in the lower layer, interlayer vias and conductive segments in intermediate conductive layers are disposed to conductively couple the conductive lines in the upper layer with the conductive lines in the lower layer.

Power gating is a technique used in IC design to reduce power consumption by shutting off the current to blocks of the circuit that are not currently in use. In addition to reducing stand-by or leakage power, power gating has the benefit of enabling CMOS IC testing for the presence of manufacturing faults.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

Figure 1:
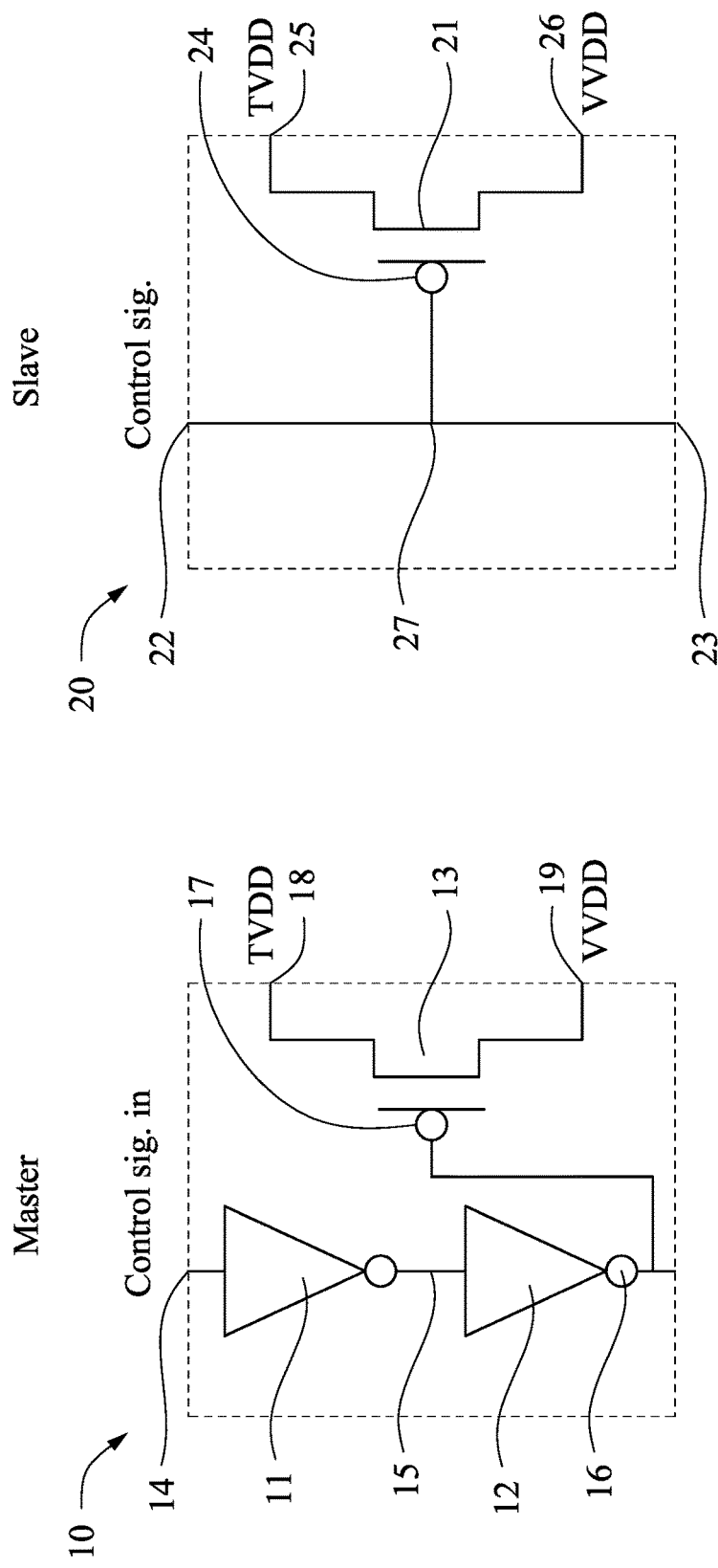
FIG. 1 is a schematic diagram illustrating a master switch cell and a slave switch cell in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

FIG. 1 is a schematic diagram illustrating a mater switch cell and a slave switch cell in accordance with some embodiments. A master switch cell 10, or a master cell, includes a first inverter 11, a second inverter 12 and a PMOS transistor 13. The control signal is fed into the input 14 of the first inverter 11, whose output 15 is fed into the input of the second inverter 12. The output of the second inverter 16 is transmitted to the gate 17 of the PMOS transistor 13. The source 18 of the PMOS transistor 13 is connected to the true power rail TVDD, and the drain 19 of the PMOS transistor 13 is connected to the virtual power rail VVDD. The first inverter 11 and the second inverter 12 form a buffer for repeating and amplifying the control signal.

VDD designates power and VSS designates ground. There are two switch cell configurations which are the header switch cell configuration and the footer switch cell configuration. The header switch cell is positioned between the true power (True VDD, or TVDD) and the logic cell. The intermediate connection between the header switch cell and the logic cell is virtual power (Virtual VDD, or VVDD). The logic cell in connected to the ground, VSS. In comparison, the footer switch cell is positioned between the logic cell and the ground VSS. The intermediate connection between the logic cell and the footer switch cell is virtual ground (Virtual VSS, or VVSS). The logic cell is connected to the power VDD. In the discussion of the embodiments below, the header switch cell configuration is discussed. To a person of ordinary skills in the art, analogous discussions apply to the footer switch cell configuration.

A slave switch cell 20, or a slave cell, includes a PMOS transistor 21. Compared to the master cell 10, the slave cell 20 does not have a buffer such as including two inverters 11 and 12. The control signal passes through the slave cell 20 from the input 22 to the output 23. The gate 24 of the PMOS transistor 21 is connected to both the input 22 and the output 23. The line 27 connecting the input 22 and the output 23 is a feed through line. The source 25 of the PMOS transistor 21 is connected to the true power rail TVDD, and the drain 26 of the PMOS transistor 21 is connected to the virtual power rail VVDD.

According to some embodiments, the size of the slave cell 20 is determined by the center poly (gate) pitch (CPP), and CPP ranges from 40 nm to 150 nm. According to some embodiments, the size of the slave cell 20 is approximately 6~8 times that of the CPP's. The master cell 10 has a size much larger than the slave cell because the slave cell does not have the buffer of the master cell 10. According to some embodiments, instead of using uniform sized switch cells, the smaller sized slave switch cells can be used where a switch cell is needed to replace a larger master switch cell. Due to the inherent smaller size of the slave cell, such implementation reduces overall sizes of the design.

Figure 2:
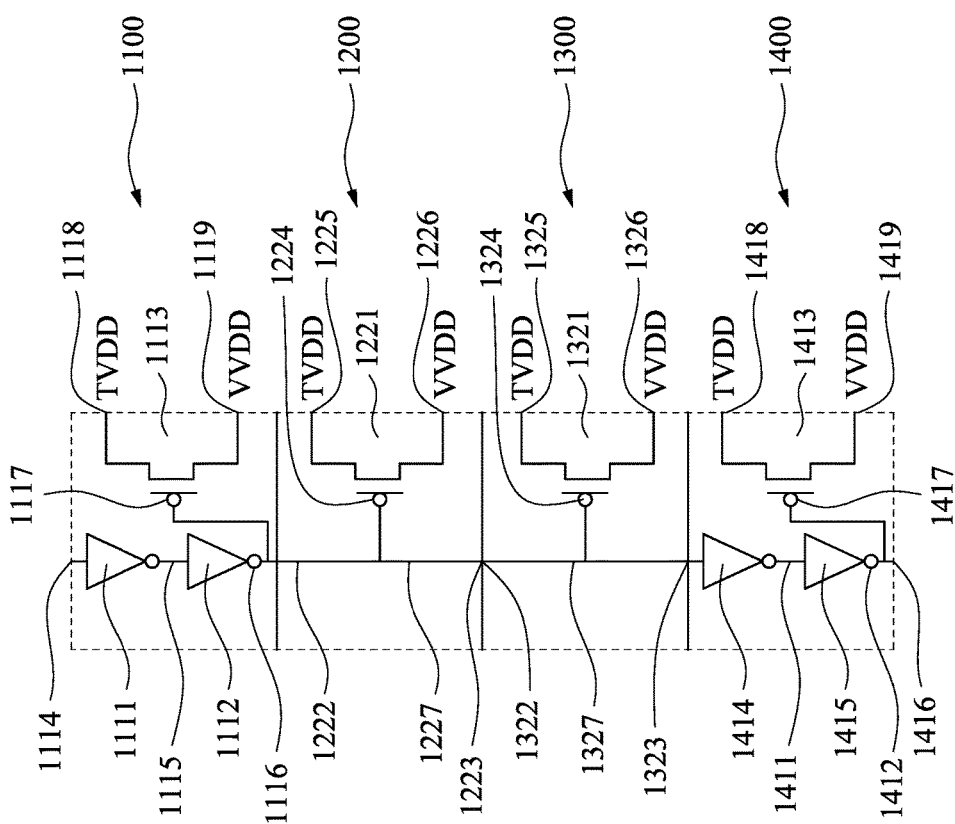
FIG. 2 is a schematic diagram illustrating the master-slave switch cell configuration in accordance with some embodiments.

FIG. 2 is a schematic diagram illustrating the master-slave switch cell configuration in accordance with some embodiments. According to the discussion above, the slave switch cells have smaller sizes compared to master switch cells. The slave switch cells, however, cannot function independently without being driven by at least a corresponding master switch cell because the slave switch cell does not have a power on/off control signal buffer discussed above. The master switch cells can drive a plurality of corresponding slave switch cells. The switch cell 1100 is a master switch cell, 1200 is a slave switch cell, 1300 is a second slave switch cell, and 1400 is a second master switch cell. According to some embodiments, the control signal comes in to the master switch cell 1100 through the input 1114. The control signal then passes through the buffer which includes the first inverter 1111 and the second inverter 1112. The control signal then pass through the slave switch cells 1200 and 1300. In this embodiment, the master switch cell 1100 drives two slave switch cells 1200 and 1300. The master switch cell 1400 drives another two slave switch cells which are not shown in the figure. The sources and drains of the PMOS transistors in the master switch cells and the slave switch cells are all connected to corresponding true power TVDD and virtual power VVDD rails. The sources 1118, 1225, 1325 and 1418 are connected to the true power TVDD rail. The drains 1119, 1226, 1326 and 1419 are connected to the virtual power VVDD rail. According to some embodiments, each master switch cell drives an equal number of slave switch cells in a column, and such a master-slave group is repeated with constant intervals on the power grid.

Figure 3:
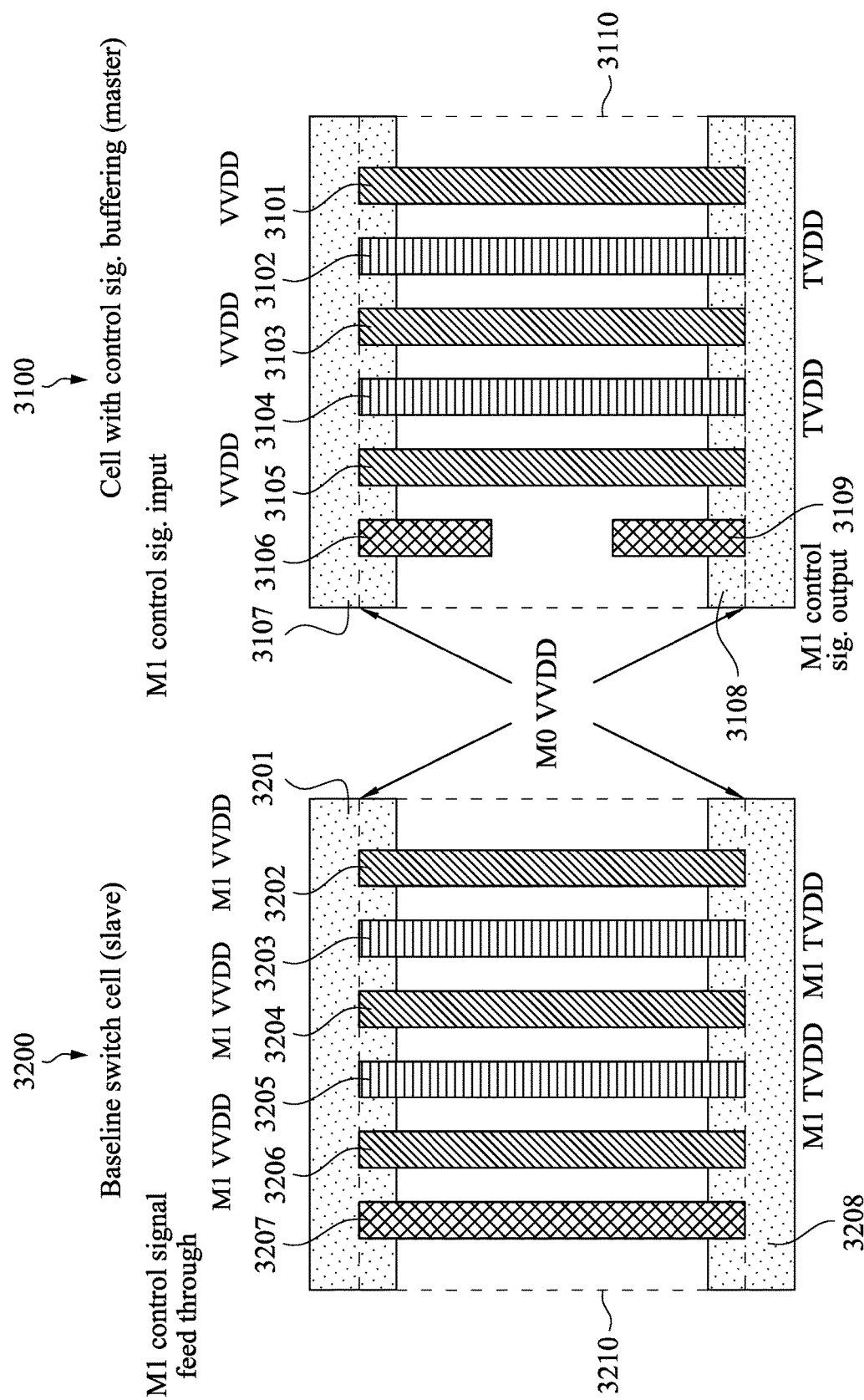
FIG. 3 is a schematic diagram illustrating the M0/M1 scheme of the master switch cell and the slave switch cell in accordance with some embodiments.

FIG. 3 is a schematic diagram illustrating the M0/M1 scheme of the master switch cell and the slave switch cell in accordance with some embodiments. The M0/M1 scheme of the master switch cell includes the M0 virtual power VVDD rails 3107 and 3108 in the M0 metal layer. The M0/M1 scheme 3100 of the master switch cell also includes: the virtual power VVDD straps 3101, 3103 and 3105 in the M1 metal layer (M1 layer) overlaying and extending between the M0 virtual power VVDD rails 3107 and 3108; the true power TVDD straps 3102 and 3104 in the M1 metal layer overlaying and extending between the M0 virtual power VVDD rails 3107 and 3108; the control signal input strap 3106 and the output strap 3109 are also in the M1 metal layer. The master switch cell 3110 is illustrated as a dash-lined rectangle overlaying and extending between the M0 virtual power VVDD rails 3107 and 3108. The control signal is transmitted into the master switch cell 3110 through the input strap 3106 and is transmitted out of the master switch cell 3110 through the output strap 3109. In some embodiments, the virtual power straps 3101, 3103 and 3105 are coupled to the virtual power VVDD rails 3107 and 3108 through vias (not shown). The true power straps 3102 and 3104 are coupled to power sources in upper metal layers through intervening metal layers and vias (not shown).

In comparison, the M0/M1 scheme 3200 of the slave switch cell includes the M0 VVDD rails 3201 and 3208. The M0/M1 scheme 3200 of the slave switch cell also includes: the virtual power VVDD straps 3202, 3204 and 3206 in the M1 metal layer; the true power TVDD straps 3203 and 3205 in the M1 metal layer; and the control signal feed-through strap 3207 in the M1 metal layer. All straps overlay and extend between the M0 virtual power VVDD rails 3201 and 3208. The slave switch cell 3210 is illustrated as a dash-lined rectangle overlaying and extending between the M0 VVDD straps 3201 and 3208. The control signal passes through the slave switch cell 3210 through the feed-through strap 3207. According to some embodiments, the TVDD and VVDD straps are self-assembling. When the straps are self-assembling, adjacent straps in different switch cells, master or slave, are conductively connected once they are placed together. According to other embodiments, the TVDD and VVDD straps are not self-assembling. Further details regarding self-assembling will be discussed in the following paragraphs. In some embodiments, the virtual power straps 3102, 3104 and 3106 are coupled to the virtual power VVDD rails 3201 and 3208 through vias (not shown). The true power straps 3203 and 3205 are coupled to power sources in upper metal layers through intervening metal layers and vias (not shown).

Figure 4:
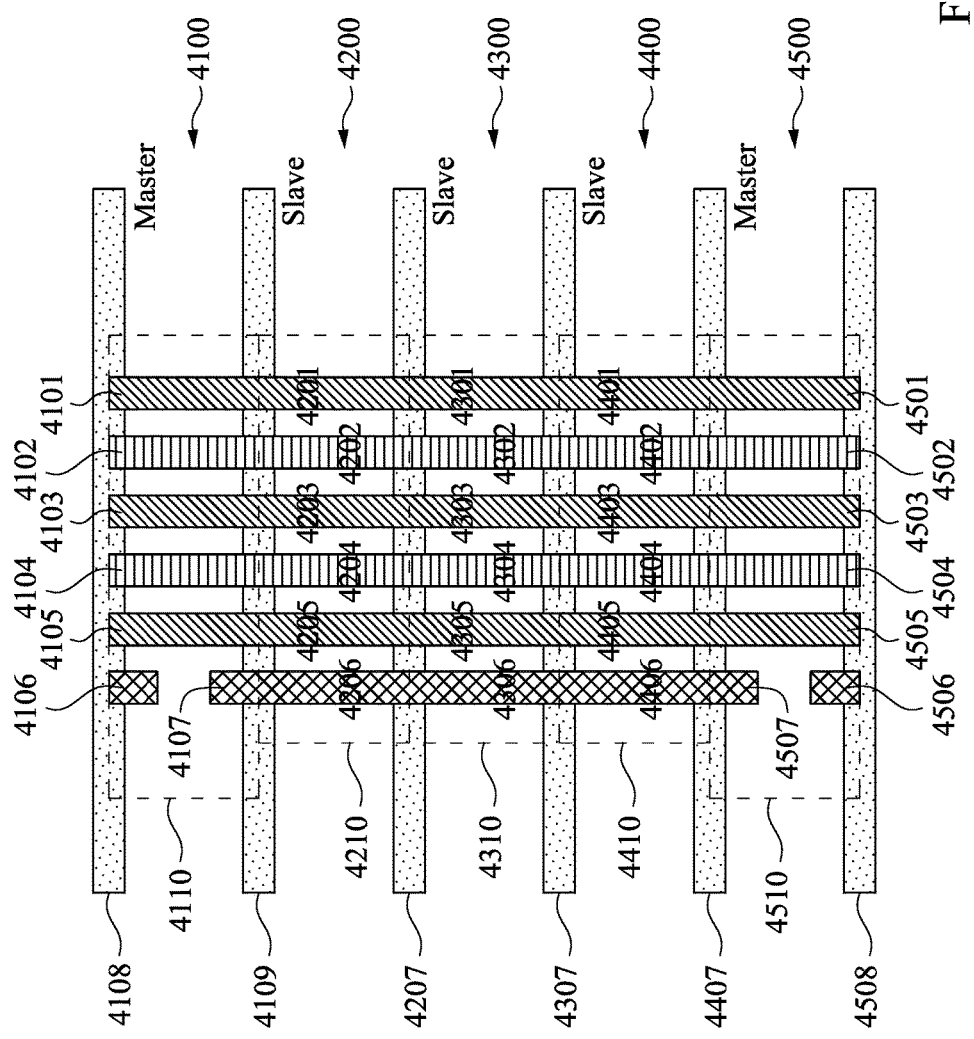
FIG. 4 is a schematic diagram illustrating the master-slave configuration with M0/M1 scheme in accordance with some embodiments.

FIG. 4 is a schematic diagram illustrating the master-slave configuration with M0/M1 scheme in accordance with some embodiments. According to some embodiments, two master switch cells 4100 and 4500, and three slave switch cells 4200, 4300 and 4400 are provided to form the master-slave configuration. The master switch cells 4100 and 4500 follow the same master switch cell scheme illustrated in FIG. 3, and the slave switch cells 4200, 4300 and 4400 follow the same slave switch cell scheme illustrated in FIG. 3 as well. In this embodiments, the master switch cell 4100 drives three slave switch cells 4200, 4300 and 4400. The master switch cell 4500 drives another three slave switch cells that are not shown in the figure. According to some embodiments, corresponding VVDD straps in different switch cells are aligned and form a so called "self-assembly", which means that each VVDD strap is not only aligned with other adjacent VVDD straps in the adjacent switch cells, but is also conductively connected to or formed with the other adjacent VVDD straps in the adjacent switch cells to form a continuous strap. When the VVDD straps are self-assembling, the overall IR (voltage drop) is smaller. According to other embodiments, the VVDD straps are not self-assembling to allow for flexible power-on sequence. The TVDD straps are optional and are not self-assembling. When TVDD straps are implemented, the TVDD straps are only aligned but do not necessarily form "self-assembly", which means that TVDD straps may or may not be conductively connected to other adjacent TVDD straps in adjacent switch cells, which allows for flexible routings.

The control signal comes in from the input strap 4106 of the first master switch cell 4110, and the output comes out of the output strap 4107 of the master switch cell 4110. The control signal then passes through the pass-through strap 4206 of the slave switch cell 4210, then through the pass-through strap 4306 of the next slave switch cell 4310, then through the pass-through strap 4406 of the next slave switch cell 4410. The master switch cell scheme 4500 is a mirror image of the master switch cell scheme 4100. In 4500, the input strap is 4506 and the output strap is 4507. The output strap 4507 is conductively connected to the output strap 4107 through pass-through straps 4206, 4306 and 4406. According to some embodiments, in FIG. 4, the adjacent VVDD straps 4101, 4201, 4301, 4401 and 4501 in adjacent switch cells are all conductively connected. Similarly, the adjacent VVDD straps 4103, 4203, 4303, 4403 and 4503 are also conductively connected. Similarly, the adjacent VVDD straps 4105, 4205, 4305, 4405 and 4505 are also conductively connected. According to other embodiments, the VVDD straps 4101, 4201, 4301, 4401 and 4501 are not necessarily all conductively connected, which means that they are not self-assembling. When the straps are not self-assembling, more flexible power-on sequences are allowed. For example, instead of being connected to an adjacent strap, a VVDD strap can be connected to a non-adjacent strap in a non-adjacent switch cell through appropriate wiring. Similarly, the input straps, the output straps and the feed-through straps can also be connected to a distant strap in a distant switch cell. In some embodiments, the virtual power straps VVDD's are coupled to the virtual power VVDD rails through vias (not shown). The true power straps are coupled to power sources in upper metal layers through intervening metal layers and vias (not shown).

Figure 5:
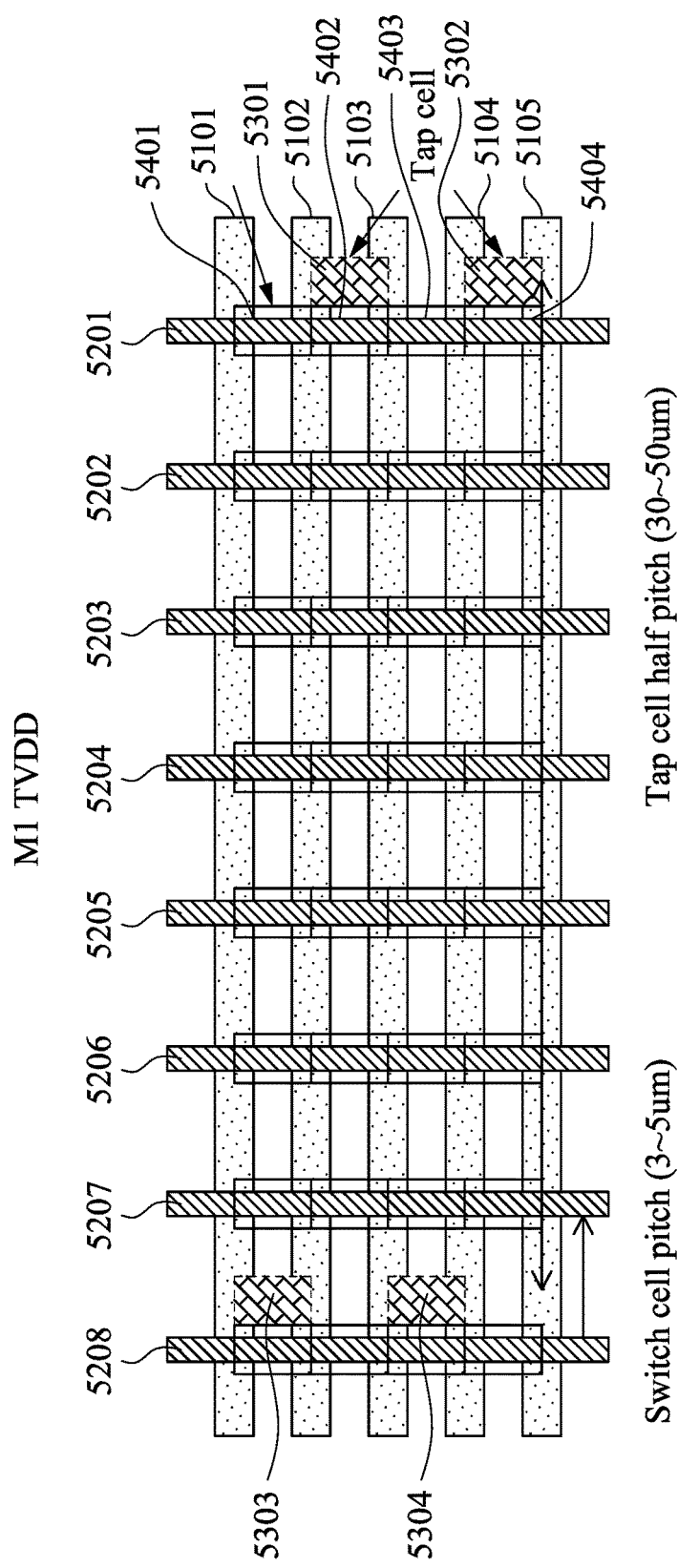
FIG. 5 is a schematic diagram illustrating VVDD power grid structure with switch cells and tap cells placement in accordance with some embodiments.

FIG. 5 is a schematic diagram illustrating a VVDD power grid structure with switch cells and tap cells placed in accordance with some embodiments. According to some embodiments, the basic strategy of power gating is to provide two power modes: a low power mode and an active power mode. The design goal is to switch between these modes at the appropriate time and in the appropriate manner to maximize power savings while minimizing the impact to performance. According to some embodiments, the M0 VVDD rails include: 5101, 5102, 5103, 5104, and 5105. The M1 VVDD rails include: 5201, 5202, 5203, 5204, 5205, 5206, 5207 and 5208. According to some embodiments, four tap cells, 5301, 5302, 5303 and 5304, are distributed on the grid in regular intervals. Each tap cell is a connection to the P-well or N-well substrate of the PMOS or NMOS transistors in the standard cell. The tap cells are provided within the standard cells so that a high resistance does not develop between the substrate of the transistors in the standard cells and the power or ground reference. The placement of standalone tap cells 5301, 5302, 5303 and 5304 produces less area impact on the IC compared to conventional tap placement within other switch cells. According to some embodiments, 32 switch cells 5401, 5402, 5403, ... 5432 are implemented. The master switch cells and the slave switch cells are not differentiated in the illustration of FIG. 5. As discussed above, master switch cells are placed with regular intervals and each master switch cell drives an equal number of slave cells. The master-slave pattern repeats regularly over the power grid. According to some embodiments, standard cells (which are not shown in the figure) fill the interval between the switch cells. According to some embodiments, the switch cells 5401, 5405, 5409, 5413, 5417, 5421, 5425 and 5429 are master switch cells driving corresponding slave switch cell below them. For example, the master switch cell 5401 drives the slave switch cells 5402, 5403 and 5404. The pitch is the distance between one polysilicon lead and another polysilicon lead in the integrated circuit. According to some embodiments, the switch cell pitch is 3~5 μm and the tap cell half pitch is 30~50 μm. The size of standard cells are a multiple of a certain design unit. The vertical size unit is cell height, which is around 0.2 μm~1 μm in state of the art technology. The horizontal size unit is gate pitch which is around 40 nm~100 nm. The standard cell size is typically 1× or 2× of the cell height, and 3× to 30× of the gate pitch. According to some embodiments, the master switch cell size is 2× of cell height, and 6×-10× of the gate pitch. The slave switch cell size is of 2× cell height, and 4×-8× gate pitch. In some embodiments, the virtual power straps VVDD's are coupled to the virtual power VVDD rails through vias (not shown). The true power straps are coupled to power sources in upper metal layers through intervening metal layers and vias (not shown).

According to some embodiments, the resistance of a single switch cell, either master or slave, is 120~300Ω, as compared to 20~50Ω of the conventional single switch cell. The total resistance of power grid network through multiple paths is around 5~10Ω.

Figure 6:
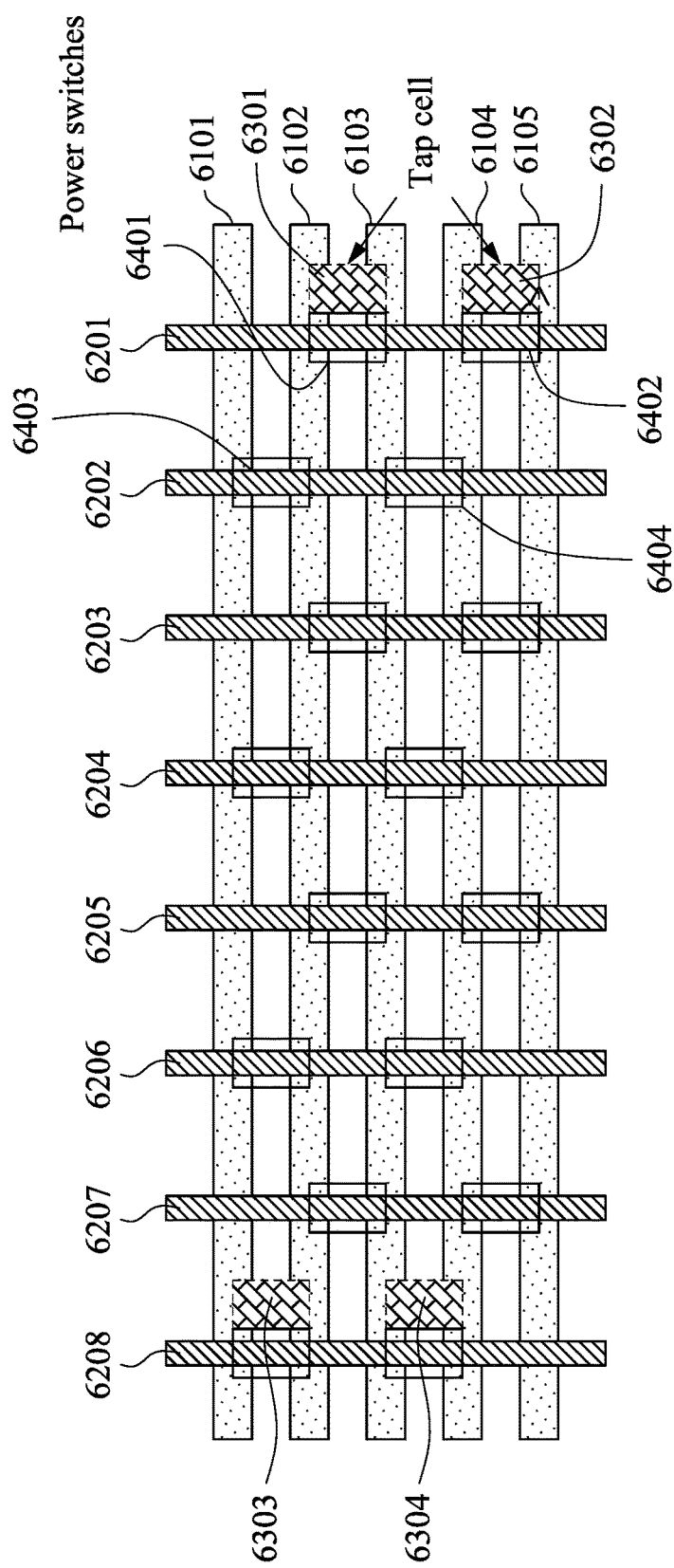
FIG. 6 is a schematic diagram illustrating VVDD power grid structure, switch cells and tap cells staggering placement in accordance with some embodiments.

FIG. 6 is a schematic diagram illustrating VVDD power grid structure, switch cells and tap cells in staggered placement in accordance with some embodiments. According to some embodiments, the M0 VVDD rails include: 6101, 6102, 6103, 6104, and 6105. The M1 VVDD rails include: 6201, 6202, 6203, 6204, 6205, 6206, 6207 and 6208. According to some embodiments, four tap cells 6301, 6302, 6303 and 6304 are placed at regular intervals. Instead of being evenly distributed as illustrated in FIG. 5, the switch cells are staggered. As in FIG. 5, the master switch cells and the slave switch cells are not differentiated in the illustration. For example, the switch cell 6401 is staggered away from switch cell 6403, and the switch cell 6402 is staggered away from the switch cell 6404. The staggered placement of switch cells reduces area impact on the IC because fewer switch cells are placed on the IC. Standard cells (not shown in the figure) are placed between the intervals of the switch cells. In some embodiments, the virtual power straps VVDD's are coupled to the virtual power VVDD rails through vias (not shown). The true power straps are coupled to power sources in upper metal layers through intervening metal layers and vias (not shown).

Figure 7:
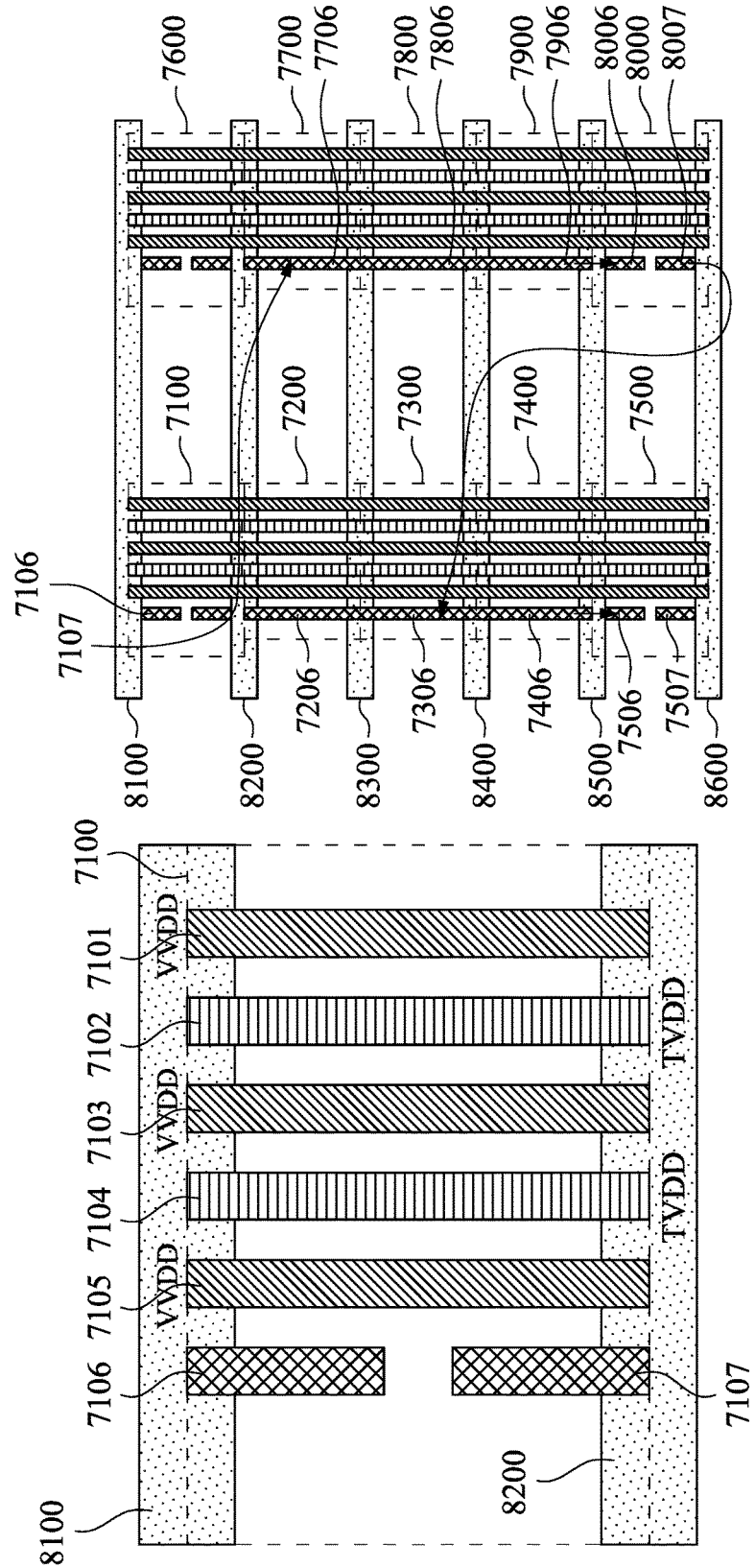
FIG. 7 is a schematic diagram illustrating master and slave switch cells without self-assembling control straps in accordance with some embodiments.

FIG. 7 is a schematic diagram illustrating master and switch cells without self-assembling straps in accordance with some embodiments. Master switch cells 7100, 7500, 7600, 8000 and slave switch cells 7200, 7300, 7400, 7700, 7800, 7900 are formed between the corresponding M0 VVDD straps 8100, 8200, 8300, 8400, 8500 and 8600. The details of the master switch cell 7100 are shown on the left. The M1 VVDD straps 7101, 7103 and 7105 are overlay and extend between the M0 VVDD rails 8100 and 8200. The M1 TVDD straps 7102 and 7104 are also overlay and extend between the M0 VVDD rails 8100 and 8200. The input 7106 is overlaid to the M0 VVDD rail 8100, and the output 7107 is overlaid to the M0 VVDD rail 8200. Other master switch cells and slave switch cells are similarly overlaid between the corresponding M0 VVDD rails. According to some embodiments, the control signal straps of the master switch cells, for example the input strap 7106 and the output strap 7107 of master switch cell 7100, are not of the self-assembling type to allow for more flexible power-on sequence. As discussed earlier, if the signal straps are self-assembly, then the corresponding signals straps automatically align with adjacent straps and become conductively connected. According to some embodiments, if the signal straps are not self-assembling, then after the design of switch cells has finished, a "place-and-route" software can be used to design alternative power-on sequences for switch cells.

For example, when the signal straps are not self-assembling, the signal straps can be routed in the following way: the routing starts with input strap 7106 of the switch cell 7100, the output strap 7107 is not self-assembled to the adjacent signal strap 7206 of the adjacent slave cell 7200, but is instead routed to a distant signal strap 7706 of a distant slave cell 7700. The signal straps 7706, 7806 and 7906, of slave cells 7700, 7800 and 7900 respectively, are conductively connected to each other. The signal strap 7906 is further connected to the input strap 8006 of the adjacent master switch cell 8000. The output strap 8007 is further routed to a distant signal strap 7306 that is conductively connected to the adjacent signal straps 7206 and 7406 of the adjacent slave switch cells 7200 and 7400. The signal strap 7406 is further routed to the input strap 7506 of the adjacent master switch cell 7500. The routing starts from input strap 7106 of master switch cell 7100 and ends with output strap 7507 of master switch cell 7500. The routing in the above example allows for more flexible power-on sequence, which may include distant switch cells. In some embodiments, the virtual power straps VVDD's are coupled to the virtual power VVDD rails through vias (not shown). The true power straps are coupled to power sources in upper metal layers through intervening metal layers and vias (not shown).

Figure 8:
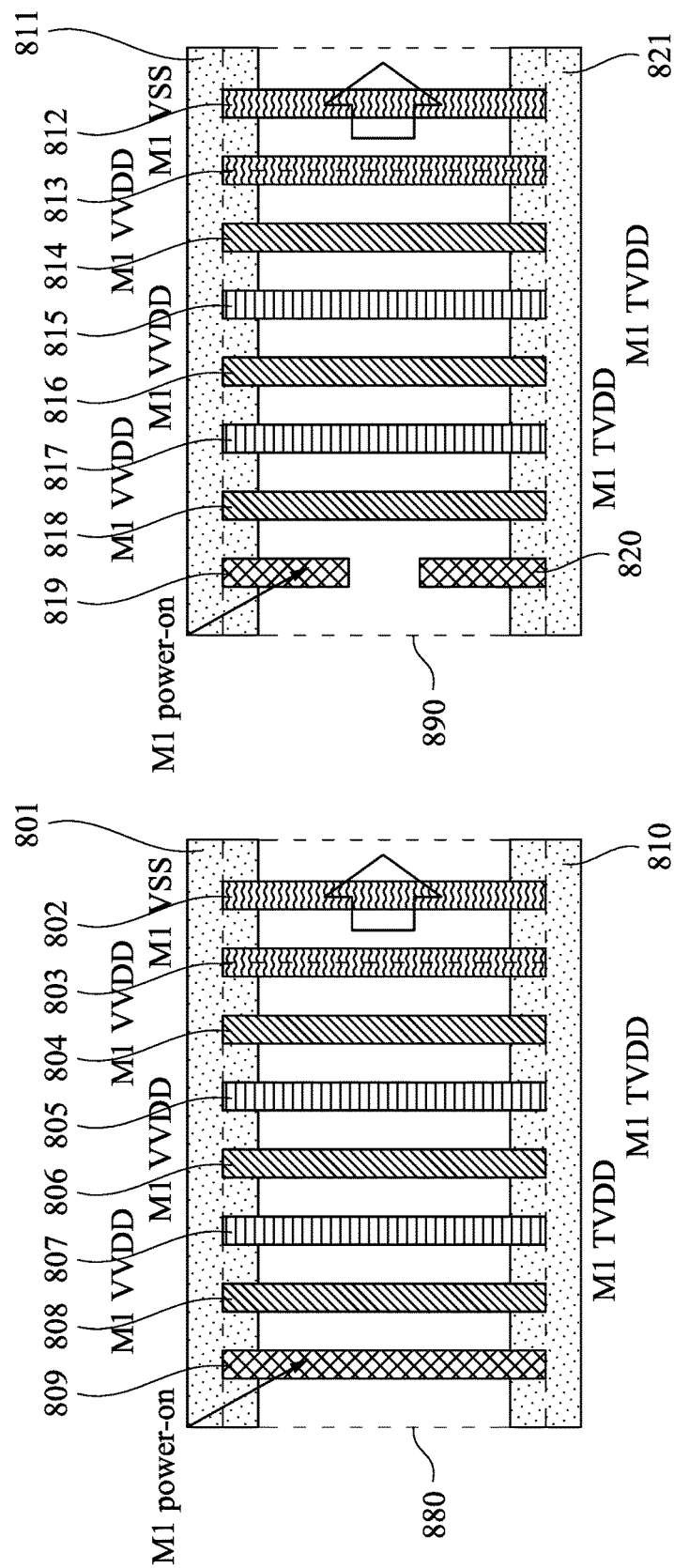
FIG. 8 is a schematic diagram illustrating a master switch cell with VSS straps and a slave switch cell with VSS straps in accordance with some embodiments.

FIG. 8 is a schematic diagram illustrating a master switch cell with VSS straps and a slave switch cell with VSS straps in accordance with some embodiments. A slave power switch cell 880 is located between the M0 power rails 801 and 810. The M1 VSS straps 802 and 803 are overlaid between the M0 power rails 801 and 810. The M1 VVDD straps 804, 806 and 808 are overlaid between the M0 power rails 801 and 810. The M1 TVDD straps 805 and 807 are also overlaid between the M0 power rails 801 and 810. The feed-through strap 809 overlays and extends between the M0 VVDD rails 801 and 810. The input strap 819 overlays the M0 VVDD rail 811; and the output strap 820 overlays the M0 VVDD rail 821. With the inclusion of M1 VSS straps 802 and 803 in addition to M1 VVDD and M1 TVDD straps, more PMOS can be included in the switch cell to reduce the turn-on resistance. Similarly, the M1 VSS straps 812 and 813 are included in a master switch cell 890 in addition to the M1 VVDD straps 814, 816 and 818, and the M1 TVDD straps 815 and 817, the input strap 819 and the output strap 820. Further benefits of the placement of 802, 803, 812 and 813 are discussed in the following paragraphs. In some embodiments, the virtual power straps VVDD's are coupled to the virtual power VVDD rails through vias (not shown). The true power straps are coupled to power sources in upper metal layers through intervening metal layers and vias (not shown).

Figure 9:
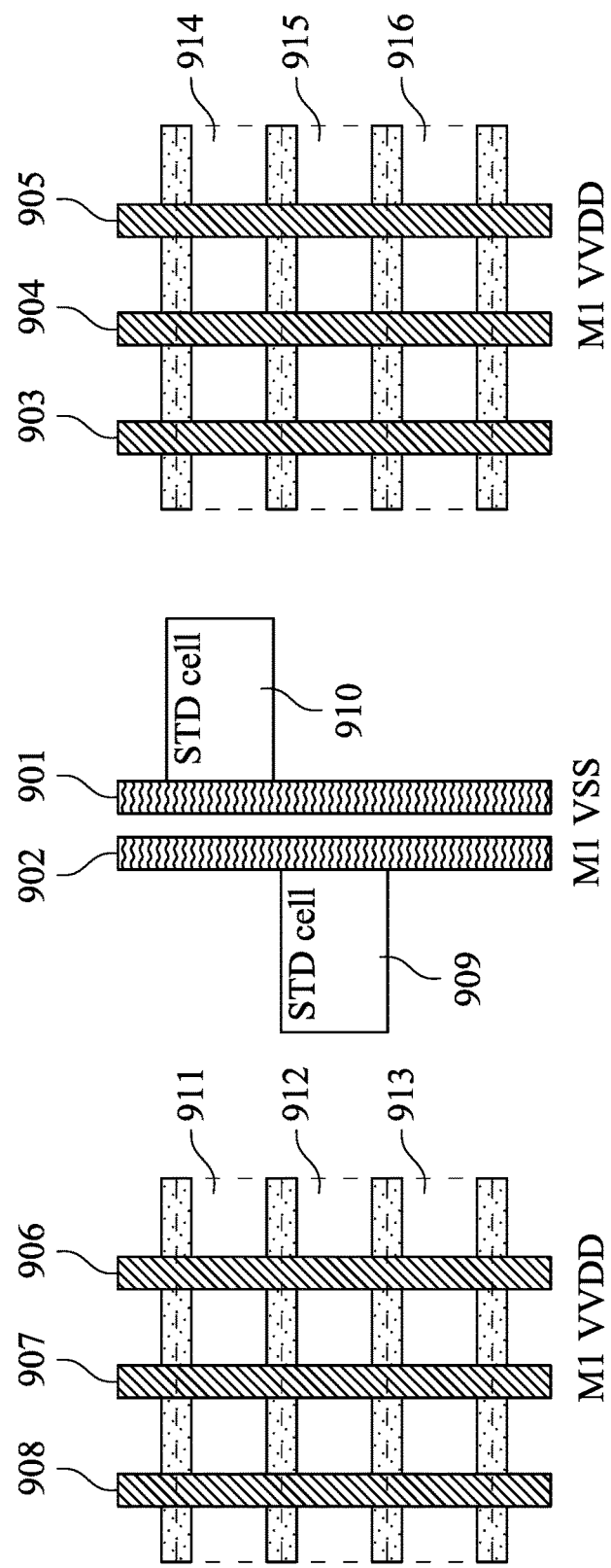
FIG. 9 is a schematic diagram illustrating the placement of standalone VSS straps in accordance with some embodiments.

FIG. 9 is a schematic diagram illustrating the placement of standing alone VSS straps in accordance with some embodiments. The standalone M1 VSS straps 901 and 902 are not included with the switch cells 911, 912, 913, 914, 915 and 916, which overlay and extend between the corresponding power rails. The M1 VVDD straps 903, 904, 905, 906, 907 and 908 are parallel to the M1 VSS straps 901 and 902. According to some embodiments, the placement of M1 VSS straps 901 and 902 are blocking the placement of standard cells 909 and 910.

Figure 10:
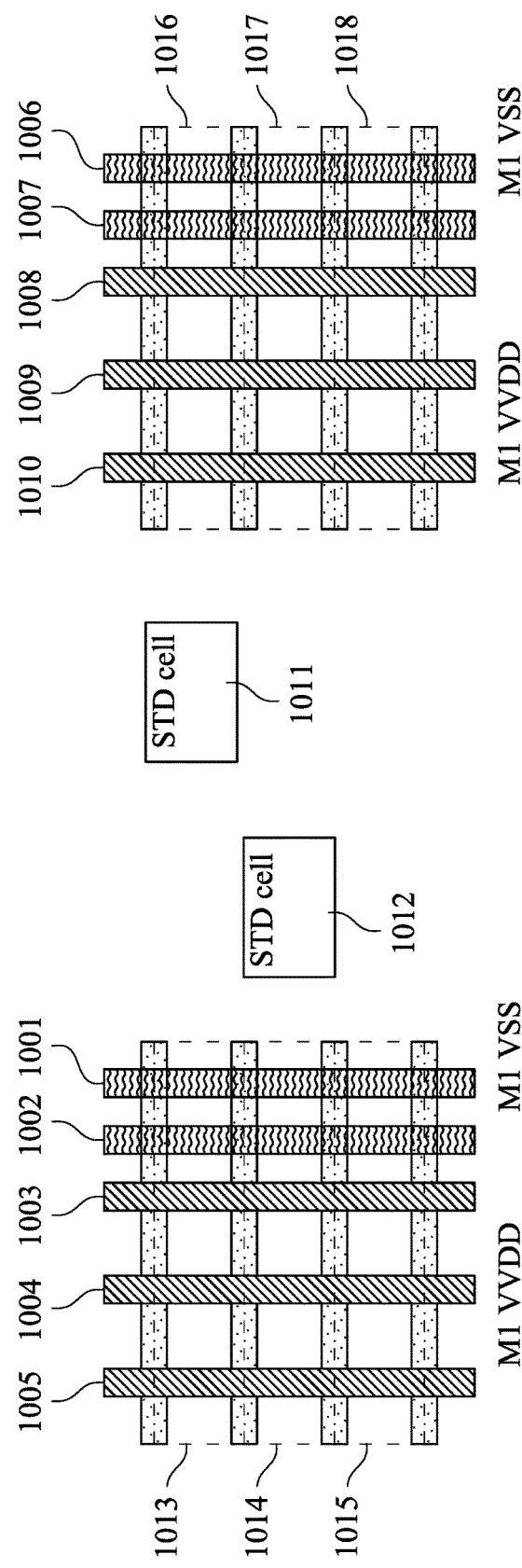
FIG. 10 is a schematic diagram illustrating the placement of M1 VSS pins clustered with switch cells in accordance with some embodiments.

FIG. 10 is a schematic diagram illustrating the placement M1 VSS straps included in switch cells in accordance with some embodiments. In comparison with the embodiment in FIG. 9, the M1 VSS straps 1001, 1002, 1006 and 1007 are included in the switch cells 1013, 1014, 1015, 1016, 1017 and 1018, which overlay and extend between corresponding power rails. The M1 VVDD straps 1003, 1004, 1005, 1008, 1009 and 1010 are also overlaid between corresponding power rails. As compared to the embodiment in FIG. 9, the placement of standard cells 1011 and 1012 are not blocked by the M1 VSS straps clustered within corresponding switch cells. Instead, the standard cells can be placed freely between the power switch cells.

Figure 11:
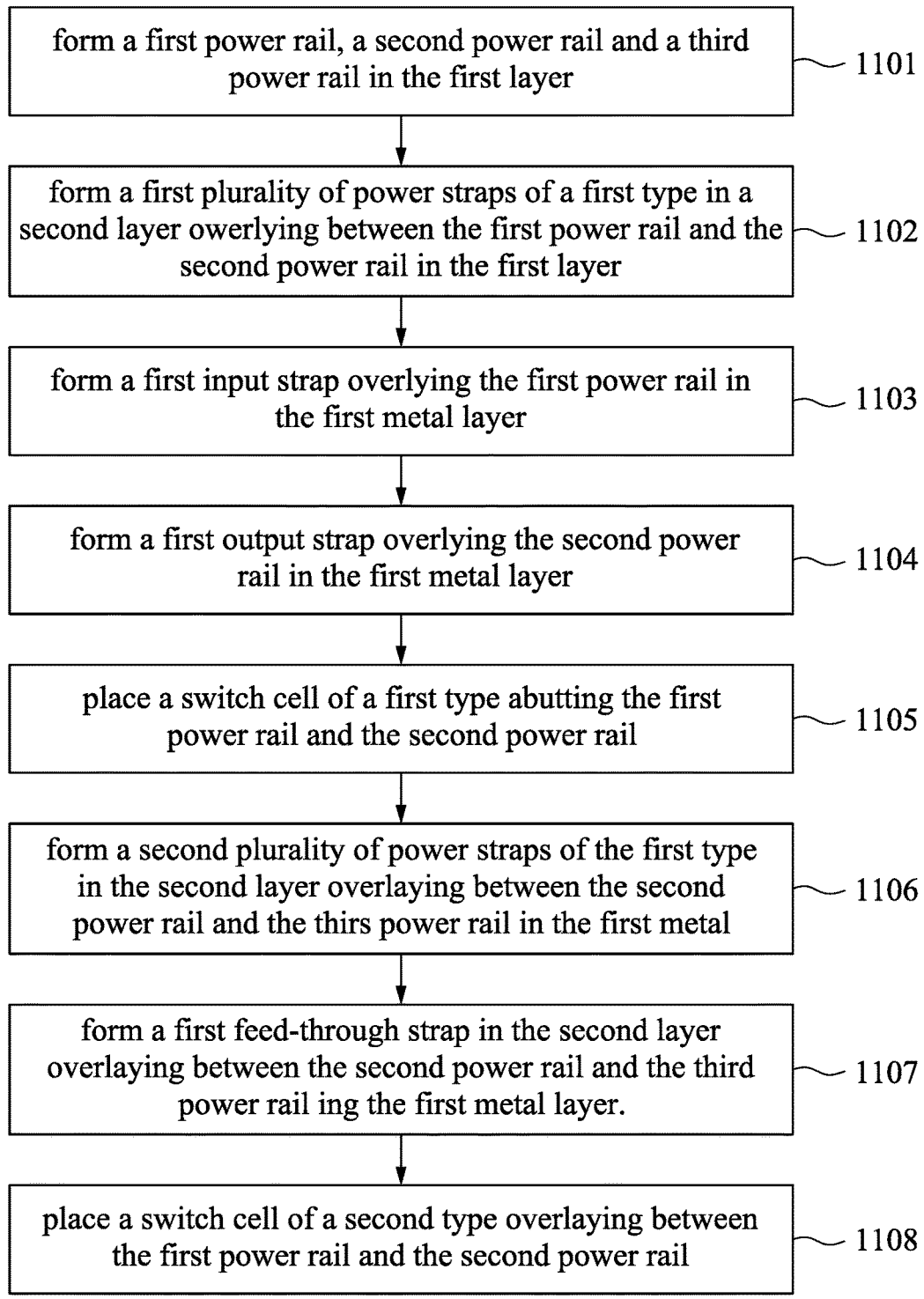
FIG. 11 is a flow chart illustrating the method of creating an integrated circuit structure having a power network and switch cells in accordance with some embodiments.

FIG. 11 is a flow chart illustrating the method of creating an integrated circuit structure having a power network and switch cells in accordance with some embodiments. At step 1101, first power, second rail and third power rails are formed in the first layer. At step 1102, a switch cell of a first type is formed adjacent the first power rail and the second power rail. At 1103, a first plurality of power rails of a first type are formed in a second layer overlying the first power rail and the second power rail from the first layer. At 1104, a first input rail is formed overlying the first power rail in a first metal layer. At step 1105, a first output rail is formed overlying the second power rail in the first metal layer. At step 1106, a second plurality of power rails of the second type is formed in the second layer adjacent the second power rail and the third power rail in the first metal layer. At step 1107, a first feed-through rail is formed in the second layer adjacent the second power rail and the third power rail in the first metal layer. At step 1108, a switch cell of a second type is formed overlying and extending between the first power rail and the second power rail.

According to some embodiments, a switch cell structure is disclosed. The switch cell structure includes a master switch cell and a plurality of slave switch cells. The master switch cell includes a buffer having an input and an output and a transistor having a gate coupled to the output of the buffer. The slave switch cell includes a respective signal line having an input and output and a transistor having a gate coupled to the signal line, the signal lines of the slave switch cells are coupled to one another, with the output of one coupled to the input of another of the signal lines. The output of the buffer of the master switch cell is coupled to an input of one of the signal lines of slave switch cells to drive the plurality of slave switch cells.

According to some embodiments, the source of the transistor in the switch cell of the first type is electrically connected to a first power rail, and the drain of the transistor in the switch cell of the first type is electrically connected to a second power rail.

According to some embodiments, the source of the transistor in the switch cell of the second type is electrically connected to a first power rail, and the drain of the transistor in the switch cell of the second type is electrically connected to a second power rail.

According to some embodiments, the input of each switch cell of the second type is electrically connected to the output of an adjacent switch cell of the first type or second type.

According to some embodiments, the output of each switch cell of the second type is electrically connected to the input of an adjacent switch cell of the second type or another adjacent switch cell of the first type.

According to some embodiments, an integrated circuit structure is disclosed. The integrated circuit structure includes a first power rail in a first metal layer, a second power rail in the first metal layer, a third power rail in the first metal layer, a master switch cell disposed between the first power rail and the second power rail, a first plurality of power straps of a first type in a second metal layer overlying and extending between the first power rail and the second power rail, a first plurality of power straps of a second type in the second metal layer overlying and extending between the first power rail and the second power rail, a first input strap in the second metal layer overlying the first power rail, a first output strap in the second metal layer overlying the second power rail, a slave switch cell disposed between the second power rail and the third power rail, a second plurality of power straps of the first type in the second metal layer overlying and extending between the second power rail and the third power rail, a second plurality of power straps of the second type in the second metal layer overlying and extending between the second power rail and the third power rail, and a first feed-through strap in the second metal layer overlying and extending between the second power rail and the third power rail. The master switch cell drives the slave switch cell.

According to some embodiments, the first plurality of power straps of the first type and the second plurality of power straps of the first type are conductively connected, the output strap and the feed-through strap are conductively connected. According to some embodiments, each of the first plurality of power straps of the first type are conductively connected to an adjacent one of the second plurality of power straps of the first type. According to some embodiments, each of the first plurality of power straps of the first type are not conductively connected to an adjacent one of the second plurality of power straps of the first type. According to some embodiments, the output strap and the feed-through strap are conductively connected. According to some embodiments, the output strap and the feed-through strap are not conductively connected. According to some embodiments, the structure further includes at least one ground strap overlaying between the first power rail and the second power rail in the first layer. According to some embodiments, the structure further includes at least one ground strap overlaying between the second power rail and the third power rail in the first layer.

According to some embodiments, a method of creating an integrated circuit structure having a power network and switch cells is disclosed. The method include the steps of forming a first power rail, a second power rail and a third power rail in a first metal layer, forming a first plurality of power straps of a first type in a second metal layer overlying and extending between the first power rail and the second power rail, forming a first input strap overlying the first power rail, forming a first output strap overlying the second power rail, disposing a master switch cell between the first power rail and the second power rail, forming a second plurality of power straps of the second type in the second layer overlying and extending between the second power rail and the third power rail in the first metal layer, and disposing a slave switch cell between the second power rail and the third power rail.

According to some embodiments, the method further includes forming a first feed-through strap in the second layer overlying and extending between the second power rail and the third power rail in the first metal layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
a first power rail in a first metal layer;
a second power rail in the first metal layer;
a third power rail in the first metal layer;
a master switch cell disposed between the first power rail and the second power rail;
a first plurality of power straps of a first type in a second metal layer overlying and extending between the first power rail and the second power rail;
a first plurality of power straps of a second type in the second metal layer overlying and extending between the first power rail and the second power rail;
a first input strap in the second metal layer overlying the first power rail, wherein the first input strap is configured to receive a control signal different than a power signal;
a first output strap in the second metal layer overlying the second power rail;
a slave switch cell disposed between the second power rail and the third power rail;
a second plurality of power straps of the first type in the second metal layer overlying and extending between the second power rail and the third power rail;
a second plurality of power straps of the second type in the second metal layer overlying and extending between the second power rail and the third power rail; and
a first feed-through strap in the second metal layer overlying and extending between the second power rail and the third power rail, wherein the first feed-through strap passes through the slave switch cell and is configured to receive the control signal from the first output strap, wherein the master switch cell drives the slave switch cell.

2. The structure of claim 1, wherein at least one of the first plurality of power straps of the first type is conductively connected to an adjacent one of the second plurality of power straps of the first type.

3. The structure of claim 1, wherein at least one of the first plurality of power straps of the first type is not conductively connected to an adjacent one of the second plurality of power straps of the first type.

4. The structure of claim 1, wherein the first output strap and the first feed-through strap are conductively connected.

5. The structure of claim 1, wherein the first output strap and the first feed-through strap are not conductively connected.

6. The structure of claim 1, further comprising at least one ground strap overlying and extending between the first power rail and the second power rail in the first metal layer.

7. The structure of claim 1, further comprising at least one ground strap overlying and extending between the second power rail and the third power rail in the first metal layer.

8. A method of creating an integrated circuit structure having a power network and switch cells, comprising:
forming a first power rail, a second power rail and a third power rail in a first metal layer;
forming a first plurality of power straps of a first type in a second metal layer overlying and extending between the first power rail and the second power rail;
forming a first input strap overlying the first power rail wherein the first input strap is configured to receive a control signal different than a power signal;
forming a first output strap overlying the second power rail;
disposing a master switch cell between the first power rail and the second power rail;

forming a second plurality of power straps of a second type in a second layer overlying and extending between the second power rail and the third power rail in the first metal layer; and disposing a slave switch cell between the second power rail and the third power rail, the slave switch cell comprising a first feed-through strap that passes through the slave switch cell, the first feed-through strap configured to receive the control signal.

9. The method of claim 8, further comprising:

forming the first feed-through strap in the second layer overlying and extending between the second power rail and the third power rail in the first metal layer.

10. The method of claim 8, wherein at least one of the first plurality of power straps of the first type are conductively connected to an adjacent one of a second plurality of power straps of the first type.

11. The method of claim 8, wherein the master switch cell comprises a buffer having an input and an output, and a transistor having a gate coupled to the output of the buffer, wherein the buffer of the master switch cell drives the slave switch cell.

12. An integrated circuit structure, comprising:
a first power rail in a first metal layer;
a second power rail in the first metal layer;
a third power rail in the first metal layer;
a master switch cell disposed between the first power rail and the second power rail;
a plurality of power straps in a second metal layer overlying and extending between the first power rail and the third power rail;
a first input strap in the second metal layer overlying the first power rail, wherein the first input strap is configured to receive a control signal different than a power signal;
a first output strap in the second metal layer overlying the second power rail;
a slave switch cell disposed between the second power rail and the third power rail; and
a first feed-through strap in the second metal layer overlying and extending between the second power rail and the third power rail, wherein the first feed-through strap passes through the slave switch cell and is configured to receive the control signal from the first output strap.

13. The integrated circuit structure of claim 12, wherein the master switch cell comprises a transistor, wherein the transistor is electrically connected to the first power rail and the second power rail.

14. The integrated circuit structure of claim 13, wherein the transistor in the master switch cell is a PMOS transistor.

15. The integrated circuit structure of claim 13, wherein the transistor in the master switch cell is a NMOS transistor.

16. The integrated circuit structure of claim 12, wherein the slave switch cell comprises a transistor, wherein the transistor is electrically connected to the second power rail and the third power rail.

17. The integrated circuit structure of claim 16, wherein the transistor in the slave switch cell is a PMOS transistor.

18. The integrated circuit structure of claim 16, wherein the transistor in the slave switch cell is a NMOS transistor.

19. The integrated circuit structure of claim 12, wherein the master switch cell drives the slave switch cell.

20. The integrated circuit structure of claim 12, further comprising a second master switch cell, and wherein an output of the slave switch cell is electrically connected to an input of the second master switch cell.

* * * * *